United States Patent [19]
Wine

[11] Patent Number: 4,503,465
[45] Date of Patent: Mar. 5, 1985

[54] ANALOG SIGNAL COMPARATOR USING DIGITAL CIRCUITRY

[75] Inventor: Charles M. Wine, Princeton, N.J.

[73] Assignee: RCA Corporation, New York, N.Y.

[21] Appl. No.: 444,165

[22] Filed: Nov. 24, 1982

[51] Int. Cl.³ .................. H03K 5/153; H04N 5/50; H04B 1/16
[52] U.S. Cl. .................. 358/195.1; 455/182; 455/186; 307/359
[58] Field of Search .................. 358/195.1; 307/354, 307/356, 358, 359, 362; 455/182, 192, 185, 186

[56] References Cited

U.S. PATENT DOCUMENTS

| | | | |
|---|---|---|---|
| 4,239,994 | 12/1980 | Stewart | 307/359 |
| 4,263,555 | 4/1981 | Hunka | 307/359 |
| 4,302,778 | 11/1981 | Tanaka | |
| 4,339,727 | 7/1982 | Kage et al. | 307/358 |
| 4,358,690 | 11/1982 | Ollendick | 307/359 |
| 4,397,038 | 8/1983 | Rzeszewski | 358/195.1 |
| 4,422,096 | 12/1983 | Henderson | 358/195.1 |

OTHER PUBLICATIONS

A. Microcomputer Controlled Frequency Synthesizer for TV, by T. Rzeszewski et al., IEEE Transaction on Consumer Electronics, vol. CE-24, No. 2, May 1978, pp. 145-153.

Memory Data Book and Designers Guide, by Mostek Corporation, dated 1980, copies of pp. 37 and 38 of Section XIII.

*Primary Examiner*—Jin F. Ng
*Attorney, Agent, or Firm*—Eugene M. Whitacre; Paul J. Rasmussen; Joseph J. Laks

[57] ABSTRACT

A microprocessor or other digital logic circuit recurrently tests the logical switching state of an input port. Based upon the outcome of such testing, the logical switching state at an output port is switched to the state opposite that of the input port. The recurrent testing develops at the output port a rectangular wave voltage that switches between upper and lower voltage levels. A filter coupled between the two ports develops at the input port a voltage representative of the average value of the output port voltage. The recurrent testing of the logical switching state of the input port produces a negative feedback of the output port voltage to the input port. The negative feedback develops a pulse-width modulated voltage at the output port that has an average value that is a multiple of the logic threshold voltage level of the digital logic circuit. To enable the digital logic circuit to perform a comparison of an analog voltage with a DC reference voltage, a second, comparison input port is coupled to the output port and is biased by the output port voltage at the logic threshold voltage level. The analog voltage and the DC reference voltage are then applied to the comparison input port. When the analog voltage exceeds the reference voltage, the voltage at the comparison port exceeds the logic threshold voltage level, resulting in the port being in a first logical switching state, and when the analog voltage is below the reference voltage, the voltage at the comparison port is below the logic threshold voltage level resulting in the input port being in the other logical switching state.

13 Claims, 7 Drawing Figures

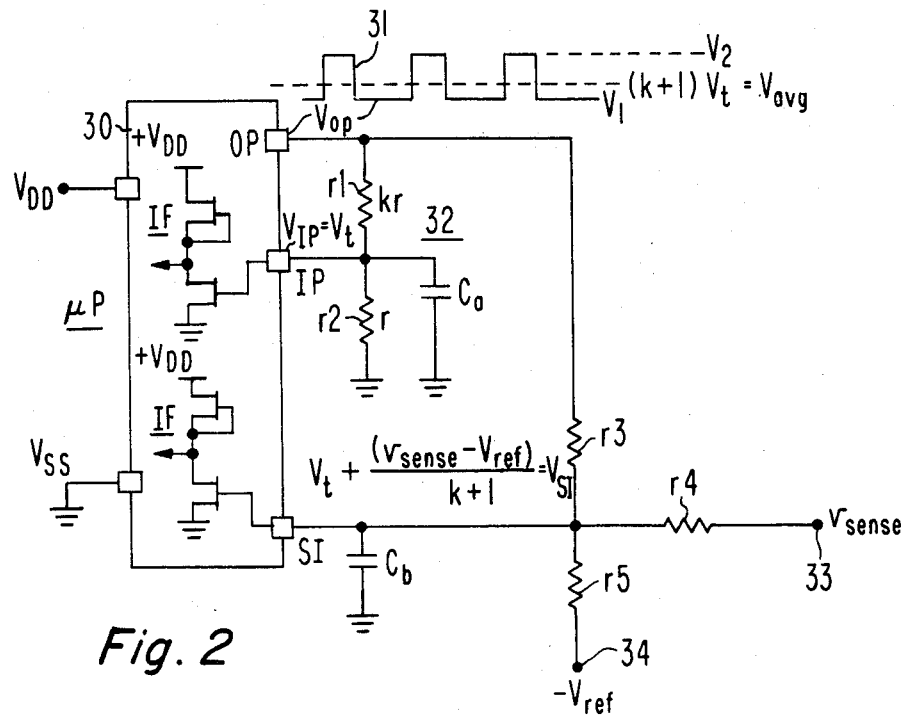
Fig. 2
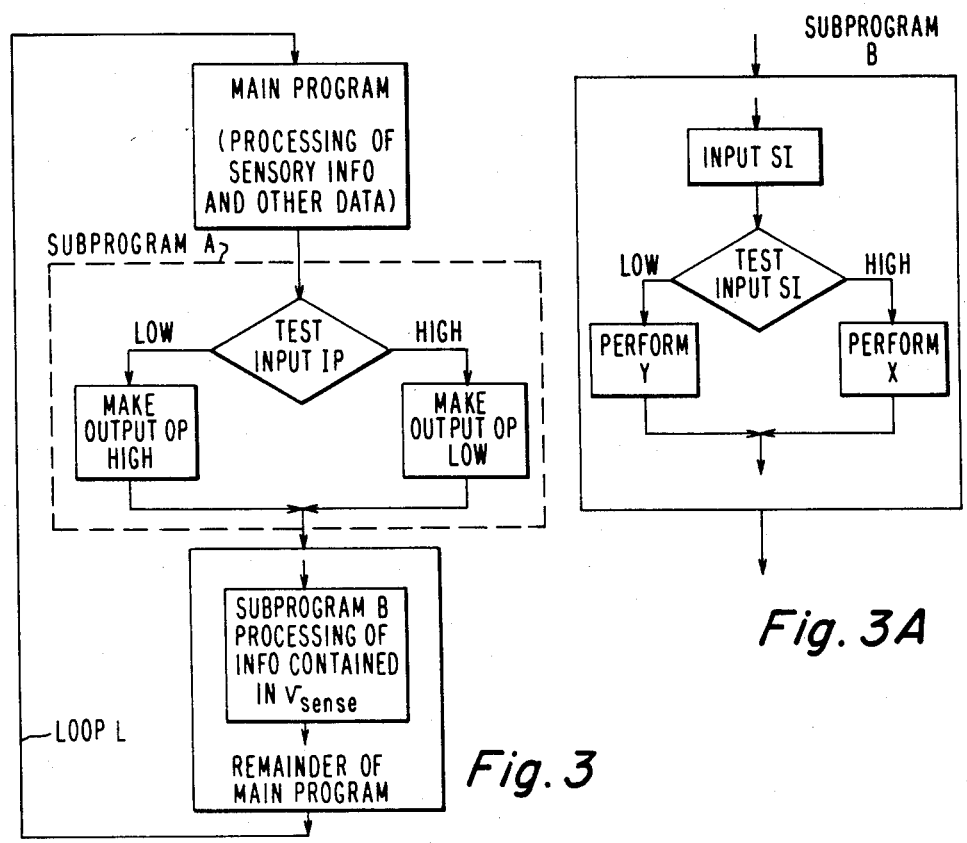
Fig. 3
Fig. 3A

ANALOG SIGNAL COMPARATOR USING DIGITAL CIRCUITRY

This invention relates to the development of a switching logic threshold voltage level or multiple thereof at either an input port or an output of a digital circuit.

The switching logic threshold voltage, $V_t$, of a digital circuit is a value such that a smaller voltage applied to an input port of the digital circuit is interpreted as a logical "0" and a greater voltage is interpreted as a logical "1". By way of example, the logic threshold voltage level, $V_t$, of a digital circuit such as a microprocessor is illustratively specified by the manufacturer to be between 0.8 volts and 2.0 volts. The manufacturer typically does not specify or test the microprocessor to a more precise logic threshold voltage level. As a result heretofore, digital circuits could not be directly employed to make comparisons between the amplitude of an analog voltage and a reference voltage.

Rather, when a digital circuit or microprocessor required to make a logical decision based upon the results of a comparison of an analog voltage with a reference level, that comparison had heretofore been made using an analog comparator. The analog voltage and the reference voltage were applied to the comparator so as to produce at the output of the comparator either a logical "1" or a logical "0". The output of the comparator was then applied to an input port of the digital circuit.

A feature of the invention is to generate with precision the logic threshold voltage level $V_t$ at a port of a digital circuit such as a microprocessor, without a priori knowing the value of that voltage. After the voltage $V_t$ is generated, the voltage may then be used as a bias voltage in a digital comparator arrangement.

A microprocessor or other digital circuit recurrently tests the logical switching state of an input port and based upon such testing switches the state of an output port to the state that is opposite that of the input port. The output port voltage is fed back to the input port to develop at the input port a voltage representative of the average value of the output port voltage. The recurrent testing of the input port voltage and switching of the output port voltage results in an output port voltage being developed that has an average value that is a multiple of the logic threshold voltage level $V_t$.

FIG. 2 illustrates a microprocessor controlled digital circuit arrangement embodying the invention that compares an analog voltage with a reference voltage;

FIGS. 3 and 3A illustrate flow charts associated with the operation of the microprocessor of FIG. 2;

Figures 1, 1A:
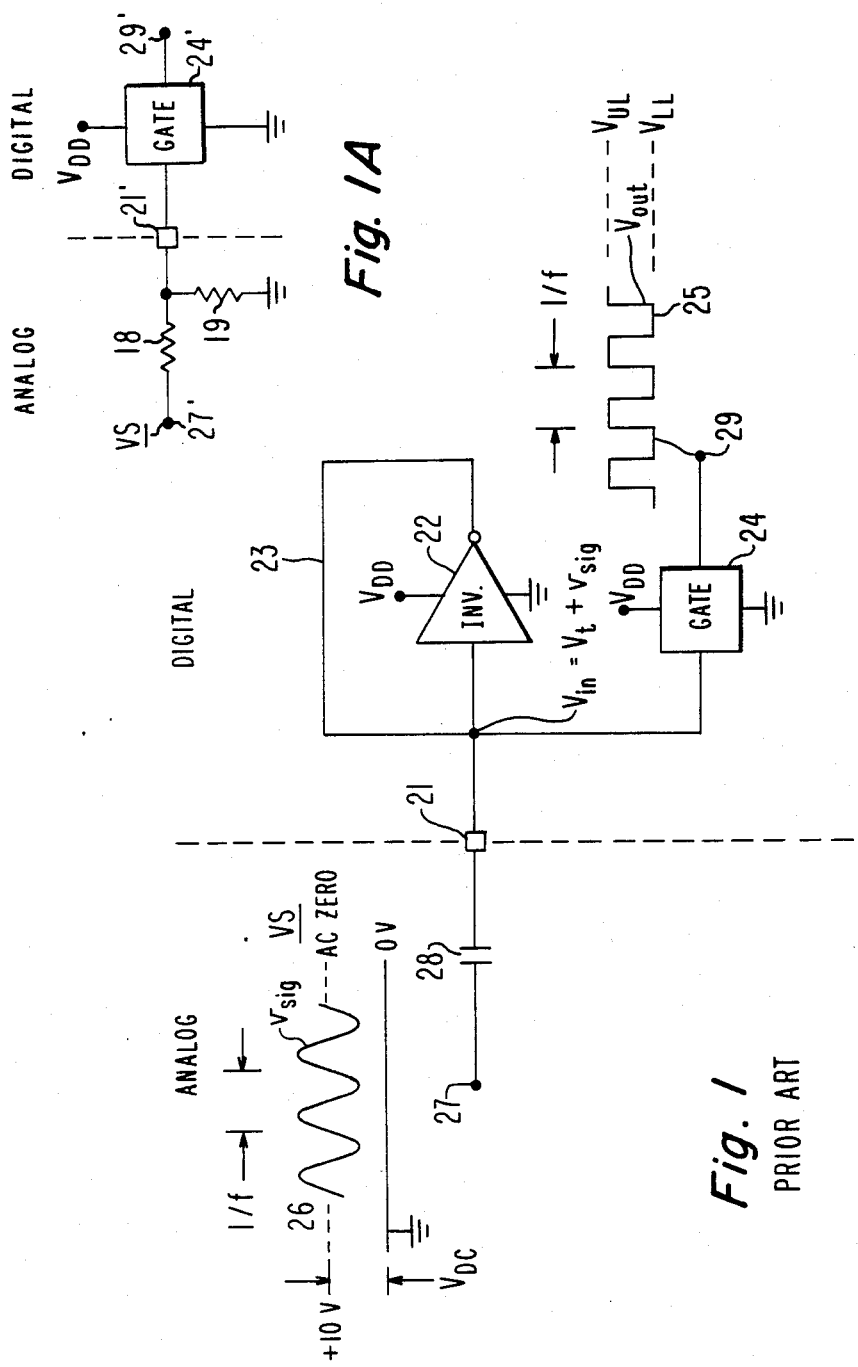
FIG. 1 illustrates a known arrangement including a short-circuited inverter that biases a port of a digital network to a voltage equal that of the switching logic threshold voltage level associated with the network.
FIG. 1A illustrates the use of a resistive attenuator that attenuates an input analog voltage to the level needed when attempting a logical comparison of the analog voltage with a reference voltage.

It is known in the prior art to generate a voltage equal to the logic threshold voltage $V_t$ by means of an arrangement including a short-circuited inverter. This arrangement may then be used as a digital comparator of an AC signal, namely a signal having no DC component. As illustrated in FIG. 1, the input terminal of an inverter 22 is coupled to an input port 21 that interfaces between digital circuitry and analog circuitry. The digital circuitry includes inverter 22 and a logic gate 24 connected to other elements not illustrated in FIG. 1, these other elements being unnecessary for the purposes of this discussion. To develop the switching logic threshold voltage level $V_t$ of the digital circuitry of FIG. 1, the output terminal of inverter 22 is short-circuited to the input terminal by way of a conductor line 23. The quiescent state of inverter 22 is such that when no analog input signal is being applied to input port 21, the voltage at the input to inverter 22 equals the switching logic threshold voltage $V_t$.

Assume now that it is desired to generate at a terminal 29 of the digital circuitry a clock signal 25 that is synchronized with an external analog signal such as the AC sinewave signal $v_{sig}$, illustrated in FIG. 1 as the waveform 26. The voltage $v_{sig}$ is superimposed, for illustrative purposes, on a DC voltage level $V_{DC}$. The total analog input signal VS developed at a terminal 27 is applied to input port 21 by way of a DC blocking capacitor 28. The voltage $V_{in}$ developed at input port 21 therefore comprises the combination of the AC signal $v_{sig}$ and the bias voltage $V_t$.

Input port 21 is coupled to the input terminal of a logic gate 24. The output terminal of logic gate 24 is coupled to terminal 29. When the AC signal voltage $v_{sig}$ is above the AC zero voltage level, the voltage $V_{in}$ at input port 21 is above the switching logic threshold voltage level $V_t$. The output of gate 24 is therefore in the logical high state, or the output voltage $V_{out}$ is at the upper level voltage $V_{UL}$. When the AC signal $v_{sig}$ is below the AC zero voltage level, the input voltage $V_{in}$ is below the switching logic threshold voltage level $V_t$. The output of logic gate 24 is therefore in the logical low state or at the lower level voltage $V_{LL}$. In this manner a digital clock signal 25 of frequency f is generated from an input sinusoidal signal $v_{sig}$ of the same frequency.

The short-circuited inverter digital comparator arrangement illustrated in FIG. 1 cannot be used when it is desired to obtain a comparison of an analog voltage signal to a non-zero, DC, reference voltage level. Assume, for example, that the analog input voltage VS is to be compared to the DC level of the signal, $V_{DC}$, at +10 V, illustratively, and that a comparison of the voltage VS with a +10 VDC reference level is to be made by means of the attenuator circuitry arrangement of FIG. 1A to develop a digital clock signal.

As mentioned previously, the switching logic threshold voltage level $V_t$ of a digital circuit may vary from 0.8 to 2.0 volts from unit to unit. Assume that the input signal VS of FIG. 1A were simply attenuated by a resistor network 18 and 19, as illustrated, to make the 10 volt comparison level correspond to the middle voltage, 1.4 volts, within the uncertainty range of 1.2 volts. Then the limits of the range of voltages at which comparisons may possibly be made at port 21 are from 5.7 to 14.3 volts. Such a wide, uncertain range of voltages at which a comparison may occur could result in a situation where no digital clock signal is produced at the output of gate 24', at terminal 29'.

A less than satisfactory solution to the problem of making a precise, reproducible comparison of an analog voltage with a DC reference voltage would be the use of adjustable resistor to attenuate the input signal VS to compensate for the actual value of the threshold voltage level $V_t$ for the particular digital circuit used. Drift in the value of the threshold voltage $V_t$ after the adjustment were made would still create uncertain comparisons.

In accordance with an aspect of the invention, the uncertainties in making a precise comparison may be avoided if the digital circuit itself were configured to develop a voltage at an output port that is a multiple of the logic threshold voltage level $V_t$ without requiring to a priori know the actual value of the threshold voltage level $V_t$. A resistive voltage divider may then attenuate the output port voltage to bias a comparison input port at the logic threshold voltage level $V_t$. The analog input voltage and the reference voltage may then be summed at the comparison input port by using a simple resistive divider network. When the input voltage exceeds the reference voltage the voltage at the comparison input port exceeds the threshold level $V_t$ resulting in the port being in a logical "1" state, and when the analog input voltage is less than the reference voltage, the voltage at the comparison input port is less than the threshold level resulting in the port being in the logical "0" state.

As illustrated in the embodiment of the invention in FIG. 2, a digital controller 30, herein embodied as a microprocessor, is provided with an output port OP, an input port IP and a sensory input port SI at which a comparison is to be made of an analog voltage $v_{sense}$ with a DC reference voltage of magnitude $V_{ref}$. The digital circuit, microprocessor 30, then uses the logical results of this comparison to perform an operation such as will be described for illustrative purposes with reference to the arrangement of FIG. 5.

Digital circuit 30 develops at output port OP a pulse-width modulated voltage $V_{OP}$, waveform 31, that switches between a lower voltage level $V_1$ and an upper voltage level $V_2$. In the microprocessor embodiment of digital circuit 30, illustrated in FIG. 2, the pulse-width modulated voltage $V_{OP}$ is developed by means of software when executing a subprogram A shown in flow chart form in FIG. 3 to be hereafter described.

A filter 32 is coupled between the output port OP and the input port IP. Filter 32 comprises a voltage divider formed by resistors r1 and r2 and a capacitor $C_a$. Resistors r1 and r2 have the values kr and r respectively. The voltage $V_{OP}$ is divided down by the divider ratio $1:(1+k)$ of the filter voltage divider. This voltage is then filtered by capacitor $C_a$ to develop a DC voltage at input port IP that is proportional to the average value $V_{avg}$ of the pulse-width modulated output port voltage $V_{OP}$.

To obtain the voltage $V_t$ at input port IP, microprocessor 30 executes subprogram A repetitively, though not necessarily at any fixed periodic rate, during execution of the main program. As indicated in the flow chart of FIG. 3, subprogram A is inserted at any convenient break point in the main program loop L that is used to process sensory information and other data. After subprogram A is executed, the loop L is re-entered to continue executing the remainder of the main program.

To develop the switching logic threshold voltage $V_t$ at input port IP, microprocessor 30 tests or interrogates input port IP by means of interface circuitry IF, generally illustrated in FIG. 2 as a common source FET arrangement. Subprogram A, when first entered determines whether or not the input port is in the high or logical "1" state or is in the low or logical "0" state. The determination is a function of whether or not the actual voltage $V_{IP}$ is above or below the threshold voltage $V_t$.

If the input port IP is determined to be in the logical high state, then subprogram A switches the output port to the logical low state. If the input port is determined to be in the logical low state, then subprogram A switches the output port to the logical high state. After these instructions are executed, subprogram A is exited and the instructions of the remainder of the main program are executed.

Recurrent execution of subprogram A, flowcharted in FIG. 3, results in a negative feedback situation wherein the output voltage $V_{OP}$ is fed back to the input port IP to develop the voltage $V_{IP}$ equal to the switching logic threshold voltage level $V_t$. Recurrent execution of subprogram A results in the voltage at input port IP converging to the switching logic threshold voltage level $V_t$ because the subprogram causes the pulse-width modulated output port voltage $V_{OP}$ to be duty cycle varied so as to produce an average output voltage $V_{avg}$ that is a multiple, k+1, of the threshold voltage level $V_t$, as determined by the divider ratio $1:(k+1)$ of resistors r1 and r2.

Should the voltage at input port IP deviate beyond precise tolerance limits from the threshold voltage $V_t$, execution of subprogram A causes the output port voltage $V_{OP}$ to assume that logical state, high or low, that is to say, to assume that voltage level, $V_1$ or $V_2$ that will oppose the deviation. This tendency to oppose the deviation produces the required duty cycle modulation of the pulses $V_{OP}$ that is necessary to maintain the average value of the voltage $V_{OP}$ at a multiple of the threshold voltage level $V_t$.

Although the duty cycle of the voltage $V_{OP}$ is determined by the actual threshold voltage level $V_t$, and by the divider ratio of filter 32, the repetition rate or the period of one cycle of the pulse-width modulated voltage $V_{OP}$ is determined by the RC time constant of filter 32, by how often subprogram A is executed and by the tolerances of the system as determined by such factors as the precision of the values of the filter components and by such other factors as electrical noise.

As mentioned previously, subprogram A, flowcharted in FIG. 3 does not have to be executed at a strictly periodic rate. The program must perform its function often enough for lowpass filter 32 to smooth the voltage $V_{IP}$ to within the tolerance wanted for the generated value $V_t$.

With the voltage at port OP at a multiple of the logic threshold voltage level, digital circuit 30 can be used as a comparator of an analog voltage with a DC reference voltage $V_{ref}$. The comparison input port SI at which the logical comparison is to be made must first be biased at the switching logic threshold voltage level $V_t$.

To accomplish this biasing, a resistive summing network comprising resistors r3, r4 and r5 is coupled between output port OP and sensory input port SI. A filter capacitor $C_b$ is coupled to port SI to provide a filtered, DC voltage. By proper proportioning of resistors r3–r5 relative to one another and relative to resistors r1 and r2, the voltage $V_{OP}$ is divided down by the same voltage divider ratio $1:(k+1)$ that is established by voltage dividing resistors r1 and r2. In this manner, the average value voltage $V_{avg}$ of the pulse-width modulated voltage $V_{OP}$ is also divided down from the value $(k+1)V_t$ at port OP to the value $V_t$ at port SI. The biasing of comparison input port SI at the switching logic threshold voltage level $V_t$ is thereby accomplished.

The sensory input voltage $v_{sense}$ developed at a terminal 33 and the DC comparison reference voltage of magnitude $V_{ref}$ developed at terminal 34 are applied to comparison input port SI through the respective resistors r4 and r5 of the summing network r3-r5. Voltages $v_{sense}$ and $-V_{ref}$ are divided down by the ratio 1:(k+1). Thus, the combined voltage at sensory input port SI is $$V_{SI}=[(v_{sense}-V_{ref})/(k+1)]+V_t$$

When the analog sensory voltage $v_{sense}$ is above the reference voltage $V_{ref}$, an interrogation by microprocessor 30 of the logical switching state of comparison input port SI, by means of interface circuitry IF, produces the determination that the input port is in the logical high state, and when the analog sensory voltage $v_{sense}$ is below the reference voltage $V_{ref}$, an interrogation produces the determination that input port SI is in the other or logical low switching state.

It is noted that by using the inventive arrangement of FIG. 2, a digital circuit, microprocessor 30, performs a comparison of an analog voltage with a DC reference voltage to produce a logical determination without the use of analog comparators or operational amplifiers and without the need for a priori knowing the actual switching logic threshold voltage level $V_t$.

Once a logical determination has been obtained by the comparison occurring at input port SI, microprocessor 30 then processes that information in the manner flowcharted in FIGS. 3 and 3A for the generalized situation. At any convenient point within the main program, either before execution of subprogram A, or, as indicated in FIG. 3, after execution of subprogram A, the main program executes a subprogram B that processes the information from the comparison of $v_{sense}$ with a DC reference voltage $V_{ref}$.

The algorithm for program B is as follows. Upon entering subprogram B the microprocessor is instructed to input the logical state of the comparison input port SI. The state of input port SI is then interrogated or tested. If the state of the input port is in the high or logical 1 state, then instruction set X is executed to perform an operation. If input port SI is in the low or logical 0 state, then instruction set Y is executed to perform a different operation. Subprogram B is then exited and the remainder of the main program executed.

Figure 4:
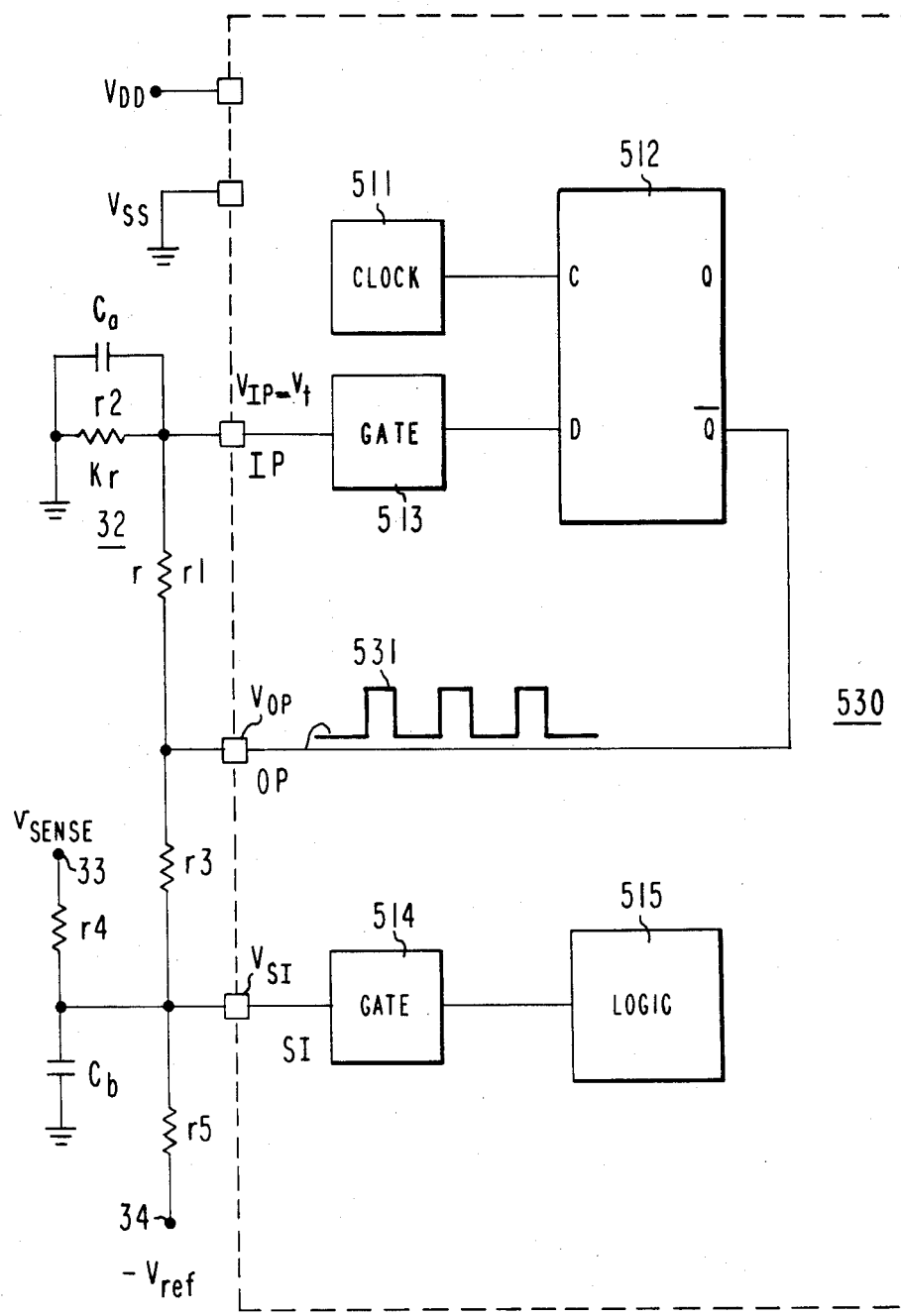
FIG. 4 illustrates another digital circuit embodying the invention that compares an analog voltage with a reference voltage.

FIG. 4 illustrates a non-microprocessor based digital controller 530 embodying the invention. Items in FIGS. 2 and 4, identified the same, function in a similar manner or represent similar quantities or element. To bias input port IP of FIG. 4 at the switching logic threshold voltage level $V_t$, the logical switching state of the input port is recurrently tested by means of a gate 513 and the C,D input portion of a Data flip-flop 512. The input of gate 513 is connected to port IP and the output is connected to the D input terminal of flip-flop 512. If the voltage at input port IP is greater than the logic threshold voltage level $V_t$, a logical "1" is gated to the D input terminal of flip-flop 512. If the voltage at input port IP is less than the logic threshold voltage level $V_t$, a logical "0" is gated to input terminal D.

The $\overline{Q}$ output terminal of flip-flop 512 is coupled to an output port OP of controller 530. To recurrently test the logical state of input port IP, a clock 511 provides a clock pulse to the C input terminal of flip-flop 512. At each clock pulse, the $\overline{Q}$ output will depend upon the logical switching state of, and therefore, the voltage at, input port IP.

If input port IP is in a logical "1" state, that is to say, the voltage at port IP is above logic threshold voltage level $V_t$, the $\overline{Q}$ output is in the low or logical "0" state. If input port IP is a logical "0" state, the $\overline{Q}$ output is in the logical "1" state. The voltage $V_{OP}$ is fed back to the input port IP by means of filter 32. In this way a pulse-width modulated voltage $V_{OP}$, waveform 531, is developed at output port OP having an average value that assumes a multiple, k+1, of the logic threshold voltage level $V_t$.

To perform a logical comparison of the voltage $v_{sense}$ with a reference voltage of magnitude $V_{ref}$, sensory input port SI is biased at the threshold voltage level $V_t$ by coupling output port OP to input port SI by way of a resistor r3 of an attenuating network r3-r5. By appropriate selection of the resistor values of the attenuating network, the voltage $V_{OP}$ is divided down to obtain a DC voltage at sensory input port SI of magnitude $V_t$ after filtering by capacitor $C_b$. In this manner the sensory voltage $v_{sense}$ is compared to a reference voltage of magnitude $V_{ref}$ to produce a logical 1 at the output of gate 514 when the voltage $v_{sense}$ is above the reference voltage magnitude $V_{ref}$, and a logical "0" when the voltage $v_{sense}$ is below the reference voltage magnitude $V_{ref}$. The result of this logical comparison is then used by a section of controller 530, designated generally in FIG. 4 as a logic block 515, to perform a logical function or operation taking into account the results of the comparison occurring at input port SI.

Figure 5:
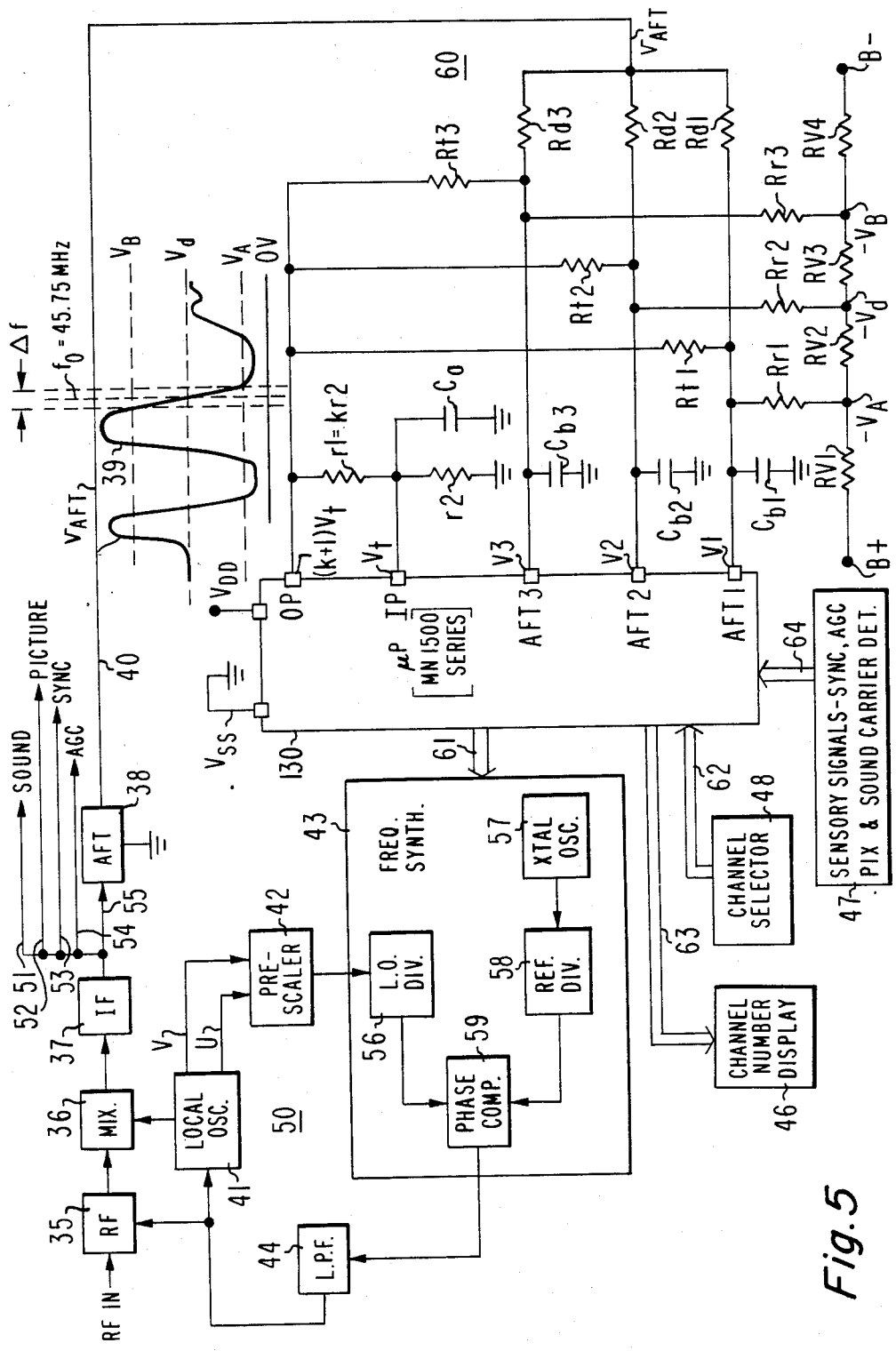
FIG. 5 illustrates a microprocessor controlled digital tuning system that provides for automatic fine tuning discriminator operation by means of digitally derived comparison occurring, in accordance with an aspect of the invention, at input ports of the microprocessor.

FIG. 5 illustrates an embodiment of the invention in the context of performing the useful function of automatic fine tuning in a television receiver. In FIG. 5, the television radio frequency signal for a selected channel having picture and sound information modulated on a carrier signal, is selected by an RF stage 35. The output of RF stage 35 is applied to a frequency converter or mixer stage 36 which heterodynes radio frequency signals selected by RF stage 35 with a local oscillator signal produced by a local oscillator 41 to convert the information contained in the RF signal to a modulated intermediate frequency signal. The intermediate frequency signal is amplified by an IF amplifier 37. The output of IF amplifier 37 is coupled along various signal lines 51-54 for processing by other stages of the television receiver, such as by the sound, picture, sync, and AGC stages.

The output of IF amplifier 37 is also coupled along a signal line 55 to a conventional automatic fine tuning discriminator circuit, AFT 38, to develop on a conductor line 40 the automatic fine tuning discriminator voltage, $v_{AFT}$, illustrated by curve 39 of FIG. 5. The voltage $v_{AFT}$ is used in a manner hereinafter to be described, to automatically fine tune to the picture carrier intermediate frequency, signal, nominally having a frequency $f_0$.

RF stage 35 and local oscillator 41 are controlled by a frequency synthesizer phase-locked loop 50. Frequency synthesizer phase-locked loop 50 is controlled in operation as to such matters as channel selection and automatic fine tuning by a microprocessor 130. The operation of frequency synthesizer phase-locked loop 50 and the programming, control, and decision making functions of microprocessor 130 are of a well known nature as described in the article "A Microcomputer Controlled Frequency Synthesizer for TV", by T. Rzeszewski, et al., IEEE Transactions on Consumer Electronics, Vol. CE-24, No. 2, May 1978, pages 145-153, and as described in U.S. Pat. No. 4,302,778 by A. Tanaka, entitled AFT-WIDE AUTOMATIC FREQUENCY CONTROL SYSTEM AND METHOD, herein incorporated by reference.

Phase-locked loop 50 includes a crystal oscillator 57 for generating a stable reference frequency signal. The output of crystal oscillator 57 is divided down to a lower reference frequency by a reference divider 58 and then applied as one input to a phase comparator 59.

The local oscillator signal, either a VHF signal on a signal line V or a UHF signal on a signal line U, depending upon the band selected, is applied to a prescaler 42 for fixed frequency division and then to a programmable local oscillator divider 56 for producing the remaining frequency division required by phase comparator 59 to compare the divided down local oscillator signal to the divided down reference signal.

When the divided down signal from local oscillator 41 is equal in frequency to the divided down signal from crystal oscillator 57, the output of phase comparator 59 is zero, neglecting the effects of any static phase error. When the two divided down signals are unequal in frequency, a varying pulse, error signal output is developed by phase comparator 59, which is then lowpass filtered by a filter 44, and applied as a DC tuning voltage to local oscillator 41 to vary the local oscillator frequency in such a manner as to equalize the two divided down signals.

Frequency synthesizer-comparator 43 is controlled in operation by digital signals developed on a signal line 61 and obtained from microprocessor 130. Microprocessor 130 accepts, along a data line 64, sensory input signals, such as vertical sync, AGC, and signals from the picture and sound carrier detectors. All these sensory inputs are designated as being derived in a block 47. The input signals inform the microprocessor of the presence of a carrier signal. In response, microprocessor 130 controls the frequency synthesizer tuning system to accurately tune to the carrier.

Channel number selection information is provided the microprocessor from a channel selector 48 along a data line 62. Microprocessor 130 then provides channel number information along a data line 63 to a display unit 46 of the television receiver.

To tune to the selected channel, microprocessor 130 controls frequency synthesizer-comparator 43 to force the frequency of local oscillator 41 to that of the selected channel. This result is accomplished by changing the count of local oscillator divider 56, or the count of reference divider 58, or the count of both dividers.

Because of such factors as RF carrier frequency offset that may occur when the source of the RF signal is a cable TV system, an automatic fine tuning function is performed. To perform such automatic fine tuning, microprocessor 130, in response to AFT discriminator information being supplied by an AFT comparator arrangement 60, embodying the invention, changes the appropriate divider count by small increments so as to enable a signal to be developed that has an intermediate frequency substantially that of the nominal intermediate frequency $f_0$.

To perform the automatic fine tuning control function, microprocessor 130 must determine from the information contained in the AFT discriminator voltage $v_{AFT}$ whether or not local oscillator 41 is tuned to within a narrow frequency range of the selected incoming RF signal. Such narrow tuning is indicated by the AFT voltage $v_{AFT}$ being tuned to within a narrow frequency range $\Delta f$ about the nominal IF frequency $f_0$. Microprocessor 130 must also determine in which direction to tune local oscillator 41 in order for the local oscillator to be tuned to the exact RF signal carrier frequency of the channel selected.

To accomplish these determinations, microprocessor 130 performs, at each of three sensory input ports, AFT1-AFT3, a comparison of the analog discriminator voltage $v_{AFT}$ with the appropriate one of three reference voltages having the magnitudes $V_A$, $V_d$, $V_B$. The voltage $V_B$ represents the discriminator voltage at the lower end of the frequency range of $\Delta f$, voltage $V_A$ represents the discriminator voltage at the upper end of the frequency range and the voltage $V_d$ represents the discriminator voltage at the nominal IF frequency, $f_0$, all as indicated by curve 39.

To perform a comparison of the analog voltage $v_{AFT}$ with a DC reference voltage, each of the input ports AFT1-AFT3 is biased at the switching logic threshold voltage level $V_t$ of microprocessor 130. To generate the logic threshold voltage $V_t$, an output port OP of microprocessor 130 is coupled to an input port IP thru a resistor r1 of voltage dividing resistors r1 and r2. A filter capacitor $C_a$ is coupled to input port IP. To generate the logic threshold voltage level $V_t$ at terminal IP and to generate a multiple threreof at output port OP microprocessor 130 is programmed with a subprogram such as subprogram A flowcharted in FIG. 3. Subprogram A may be inserted at any point within the main program controlling microprocessor 130, provided that the main program returns to this point recurrently. If the main program used to provide AFT is similar to the one flowcharted in the Rzeszewski, et al article, then a convenient point to insert subprogram A is immediately after the confluence of the three loops L1-L3 shown in FIG. 8 of the article.

To bias comparison input ports AFT1-AFT3 at the switching logic threshold voltage level $V_t$, output port OP is coupled to each of the three comparison ports by way of a respective one of resistors Rt1-Rt3 of a resistive summing network comprising resistors Rt1-Rt3, Rd1-Rd3, and Rr1-Rr3. The AFT discriminator voltage $v_{AFT}$ is coupled to the three comparison ports through a respective one of the resistors Rd1-Rd3. The appropriate one of the DC reference voltages having magnitudes $V_A$, $V_d$, $V_B$ is applied to the respective one of the comparison ports by coupling that port through a respective one of resistors Rr1-Rr3 to the junction of the appropriate two resistors of the voltage dividing resistors RV1-RV4 coupled between a B+ voltage terminal and a B− voltage terminal. Filter capacitors $C_{b1}$-$C_{b3}$ are coupled to respective ports AFT1-AFT3 to provide filtered DC voltages at the ports.

By appropriate selection of the values of the summing network resistors relative to the values of resistors r1 and r2, the voltages V1-V3 developed at ports AFT1-AFT3, respectively, equal the following:

$$V1 = V_t + (v_{AFT} - V_A)/(k+1)$$

$$V2 = V_t + (V_{AFT} - V_d)/(k+1)$$

$$V3 = V_t + (v_{AFT} - V_B)/(k+1)$$

For example, if k were selected to be 2, then r1 equals 2×r2. The average value of the voltage at output port OP is $3V_t$. If the output impedances of AFT stage 38 and of the voltage reference divider resistors RV1, RV2, RV3 and RV4 are negligable then all the resistors Rt1-Rt3, Rd1-Rd3 and Rr1-Rr3 are selected to have the same value. In such a situation the voltage V1, for examples, is $V1 = V_t + (v_{AFT} - V_A)/3$.

To derive the AFT information used by microprocessor 130 to control the fine tuning performed by frequency synthesizer-comparator 43, microprocessor 130 interrogates the logical switching states of the AFT sensory input ports AFT1-AFT3. To obtain frequency window information, microprocessor 130 tests the logical switching states of input ports AFT1 and AFT3. If input port AFT3 is in the logical "1" state, because the AFT voltage $v_{AFT}$ is greater than the reference voltage magnitude $V_B$, then local oscillator 41 is tuned too low so that the frequency of the IF signal is below the window $\Delta f$ around the nominal IF frequency $f_0$. If input port AFT1 is in the logical "0" state, then local oscillator 41 is tuned too high.

Once local oscillator 41 is tuned so that the frequency of the IF signal is within the window $\Delta f$, an interrogation of input port AFT2 will determine whether or not local oscillator 41 is tuned slightly above the nominal frequency, $f_0$ or slight below. A logical "1" at input port AFT2 indicates tuning below the nominal frequency and a logical "0" at input port AFT2 indicates tuning above the nominal frequency $f_0$. Microprocessor 130 then instructs frequency synthesizer-comparator 43 to vary the frequency of local oscillator 41 to produce substantially centered tuning.

What is claimed is:

1. An arrangement for developing at a first input port of a digital controller a voltage that is representative of the logic threshold voltage level exhibited by the digital circuitry employed by said controller for switching from one logical switching state to another logical switching state, said arrangement conprising a first input port and an output port of said digital controller, each port assuming logical switching states, means for developing at said input port a voltage representative of the voltage being developed at said output port and a logic network coupled to said first input port and to said output port for testing the logical switching state of the input port and based upon such testing switching the state of the output port to the state that is opposite that of the input port in a manner that results in said representative voltage being representative of said logic threshold voltage level.

2. An arrangement according to claim 1, wherein said representative voltage developing means includes a voltage divider having a first terminal coupled to said output port and a second terminal coupled to said input port and a filter capacitor coupled to said input port for developing at said input port a voltage representative of the average value of the voltage being developed at said output port.

3. An arrangement according to claim 1, wherein the voltage at said output port comprises a pulse-width modulated voltage having an average value proportional to said logic threshold voltage level.

4. An arrangement according to claim 3 including a voltage divider coupled to said input port and to said output port, the duty cycle of said pulse-width modulated voltage being determined by the divider ratio of said voltage divider.

5. A digital comparator of an analog sensory voltage comprising the arrangement defined in claim 1 and including a second input port of said digital controller, said output port being coupled to said second input port for biasing said second input port at a voltage representative of said logic threshold voltage level, means for developing an analog sensory voltage coupled to said second input port so that, when said analog sensory voltage is beyond a given voltage level, the voltage at said second input port exceeds the bias voltage at said second input port to produce the determination that the second input port is in a first logical switching state.

6. A digital comparator according to claim 5 including a resistive voltage divider coupled to said first input port and to said output port and having a divider ratio of $1:(k+1)$, where k is a number selected such that the average value of the voltage at said output port assumes the value of $(k+1)V_t$ where $V_t$ is the logic threshold voltage level.

7. A digital comparator according to claim 6 including means for developing a reference voltage, wherein said output port, said analog sensory voltage developing means and said reference voltage developing means are coupled to said second input port by respective resistors having relative values that result in a voltage being developed at said second input port equal to:

$$V_t + (v_{sense} - V_{ref})/(k+1)$$

where $V_{sense}$ is the analog sensory voltage and $V_{ref}$ is the reference voltage.

8. A digital comparator according to claim 7 wherein the voltage developed at said output port is a pulse-width modulated voltage having a duty-cycle that results in the average value of said pulse-width modulated voltage being equal to $(k+1)V_t$.

9. An automatic fine tuning system for a television receiver including the apparatus defined in claim 5 and including a radio frequency stage for supplying a television radio frequency signal having a picture carrier modulated with picture information, a voltage controlled local oscillator for developing a local oscillator signal, a mixer for developing an intermediate frequency signal by heterodyning the local oscillator signal is with said radio frequency signal, said intermediate frequency siganl having a picture carrier modulated with said picture information, means under the control of said digital controller for controlling the frequency of said local oscillator and an automatic fine tuning discriminator circuit for developing the aforementioned analog sensory voltage as an automatic fine tuning voltage that represents the deviation from its nominal value of the actual frequency of the picture carrier of said intermediate frequency signal, said logic network testing the logical switching state of said second input port for controlling the operation of said local oscillator frequency control means to reduce said deviation.

10. An arrangement for developing at a first input port of a microprocessor a voltage representative of the logic threshold voltage level exhibited by the digital circuitry employed by said microprocessor to switch said input port from one logical switching state to another logical switching state, said arrangement comprising said first input port and an output port of said microprocessor, each port assuming logical switching states, and means coupled to said input and output ports for developing at said input port a voltage representative of the average value of the voltage being developed at said output port, said microprocessor being programmed to recurrently test the logical switching state of the input port and based upon such testing to switch the state of the output port to the state that is opposite that of the input port, wherein execution of said program produces a voltage at said output port having an average value that is representative of said logic threshold voltage level to enable said input port to be biased at a voltage representative of said logic threshold voltage level.

11. A digital comparator of an analog sensory voltage comprising the arrangement defined in claim 10 and including means for developing an analog sensory voltage, means for developing a reference voltage, and a second input port of said microprocessor coupled to said output port and being biased at said logic threshold voltage level by the voltage developed at said output port, said second input port being coupled to said analog sensory voltage developing means and to said reference voltage developing means so that, when said analog sensory voltage is above said reference voltage, an interrogation by said microprocessor of the logical switching state of said second input port produces the determination that the second input port is in said one logical switching state and, when below said reference level, produces the determination that the second input port is in said another logical switching state.

12. An automatic fine tuning system for a television receiver including the apparatus defined in claim 11 and including a radio frequency stage for supplying a television radio frequency signal having a picture carrier modulated with picture information, a voltage controlled local oscillator for developing a local oscillator signal, a mixer for developing an intermediate frequency signal by heterodyning the local oscillator signal with said radio frequency signal, said intermediate frequency signal having a picture carrier modulated with said picture information, means under the control of said digital controller for controlling the frequency of said local oscillator and an automatic fine tuning discriminator circuit for developing the aforementioned analog sensory voltage as an automatic fine tuning voltage that represents the deviation from its nominal value of the actual frequency of the picture carrier of said intermediate frequency signal, said microprocessor testing the logical switching state of said second input port for controlling the operation of said local oscillator frequency control means to reduce said deviation.

13. An arrangement for developing at an output port of a logic network that has an input port a voltage that is representative of a multiple of the logic threshold voltage level exhibited by the digital circuitry employed by said network for switching said input port from one logical switching state to another logical switching state, said arrangement comprising means including a filter coupled to said output port and to said input port for developing at said input port a voltage representative of the average value of the voltage being developed at said output port, means for recurrently testing the logical switching state of said input port, and means responsive to said testing for switching the state of the output port to the state that is opposite that of the input port to thereby produce a voltage at said output port having an average value that is representative of a multiple of said logic threshold voltage level to enable said filter to develop at said input port a voltage substantially that of said logic threshold voltage level.

* * * * *